(12) United States Patent
Kim et al.

(10) Patent No.: US 6,987,686 B2
(45) Date of Patent: Jan. 17, 2006

(54) PERFORMANCE INCREASE TECHNIQUE FOR USE IN A REGISTER FILE HAVING DYNAMICALLY BOOSTED WORDLINES

(75) Inventors: Suhwan Kim, Nanuet, NY (US); Stephen V Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 10/733,537

(22) Filed: Dec. 11, 2003

(65) Prior Publication Data
US 2005/0127948 A1    Jun. 16, 2005

(51) Int. Cl.
*G11C 19/08* (2006.01)

(52) U.S. Cl. .............. 365/78; 365/189.01; 365/230.03; 365/230.05

(58) Field of Classification Search .................. 365/78, 365/230.05, 230.03, 189.01
See application file for complete search history.

(56) References Cited

U.S. PATENT DOCUMENTS 6,519,204 B2 * 2/2003 Slamowitz et al. .... 365/230.05

OTHER PUBLICATIONS

"A Precise On-Chip Voltage Generator for a Gigascale DRAM with a Negative Word-Line Scheme", Hitoshi Tanaka et al., IEEE Jurnal of Solid-State Circuits, vol. 34, No. 8, Aug. 1999, pp. 1084-1090.
A 130-nm 6-GHz 256 × 32 bit Leakage-Tolerant Register File, Ram K. Krishnamurthy, et al., IEEE Journal of Solid-State Circuits, vol. 37, No. 5, May 2002, pp. 624-632.
"Session 10/Low-Power & Communication Signal Processing/Paper FA 10.3", Tadahiro Kuroda et al.,.
"Dynamic Fine-Grain Leakage Reduction Using Leakage-Biased Bitlines", Seongmoo Heo et al., IEEE Proceedings of the 29$^{th}$ Annual International symposium on Computer Architecture, 2002, 11 pages.
"Dynamic Leakage Cut-off Scheme for Low-Voltage SRAM's", Hiroshi Kawaguchi, et al., IEEE Symposium on VLSI Circuits Digest of Technical Papers, 1998, pp. 140-141.

* cited by examiner

*Primary Examiner*—Anh Phung
*Assistant Examiner*—Pho M. Luu
(74) *Attorney, Agent, or Firm*—Satheesh K. Karra; Harrington & Smith, LLP

(57) ABSTRACT

For increasing the performance of a register file that is constructed to include dual-$V_t$ bitlines or single-$V_t$ bitlines. A boost of the drive signal for one of the transistors of a bitline circuit, preferably for the high voltage threshold read-selection transistor of a local bitline (LBL) circuit. The drive signal amplitude is made greater than the normal supply voltage by some increment delta V.

28 Claims, 9 Drawing Sheets

PERFORMANCE INCREASE TECHNIQUE FOR USE IN A REGISTER FILE HAVING DYNAMICALLY BOOSTED WORDLINES

TECHNICAL FIELD

These teachings relate generally to data processor hardware and, more specifically, relate to register files and to circuit constructions suitable for use in high performance register files containing bitlines and wordlines.

BACKGROUND

Register files are performance-critical memory components that typically can be found in general purpose microprocessors and other types of digital data processors. A register file is typically required to meet the following constraints: 1) exhibit a single clock cycle read/write latency that can support back-to-back read and write operations; and 2) provide multiple read/write port capability to enable the simultaneous access by several execution units in a superscalar architecture. These requirements, coupled with the demand for a large number of word entries per port, have traditionally necessitated the use of wire—OR type dynamic circuits for the local and global bitlines (i.e., for those circuit paths that convey the input and output data bits).

In accordance with CMOS technology scaling, and in order to achieve high performance, the supply voltage $V_{dd}$ and threshold voltage $V_t$ are both scaled to maintain approximately the same $V_{dd}/V_t$ ratio. However, aggressive $V_t$ scaling results in an exponential increase in bitline active leakage currents, and also results in a poor bitline noise immunity scaling trend. Therefore, alternate bitline circuit techniques that curtail the poor bitline noise immunity scaling trend are required in order to achieve high noise immunity while sustaining high performance.

Previous techniques have involved the use of negative wordline drivers, dynamic threshold voltage adjustment via substrate/well bias control, and pseudo-static bitlines.

FIG. 1 shows the organization of a conventional 4-read, 2-write ported 256-word×40-bit/word register file 1. The register file 1 contains four read address decoder circuit sections 2, two write address decoder circuit sections 3, and a 40-bit register file array 4 arranged as a 40 slice bitline stack. A complete read operation is performed in two clock cycles. An 8-bit read/write address per port is decoded in section 2 in the first cycle to deliver the read/write select signals into the register file array 4. The decoder 2 is non-critical, and therefore can be implemented in conventional static CMOS circuitry. In the next cycle, which is critical in terms of performance, the actual bitline read operation is conducted. FIG. 2 shows one bit slice for one read-port path, while FIG. 3 shows the four full-swing local bitlines. The four local bitlines are totally independent of each other, sharing only the bitcells. Each local bitline (LBL) supports 16 bitcells and a two-way merge via a static NMOS gate that drives a global bitline (GBL). A bitcell has two-write-ports and four-read-ports. Both reading and writing are single ended.

With regard now to the use of dual-$V_t$ dynamic bitlines, the LBL and GBL dynamic ORs are susceptible to noise due to high active leakage during evaluation when the precharged domino node should stay high. LBL is particularly more sensitive than GBL due to a small domino node stored charge and a wider dynamic OR structure.

FIG. 4 shows a worst-case bitline noise scenario in which all low-$V_t$ transistors (LVTs) are used to maximize the performance of the read operation.

A dual-$V_t$LBL uses a high-$V_t$(HVT) on the read-selection transistor and a low-$V_t$(LVT) on the bitcell data transistors, as shown in FIG. 5. The use of the high-$V_t$ transistors limits the bitline leakage. However, this benefit is achieved at the cost of degraded performance due to the reduced drive currents to the high-$V_t$ transistors.

FIG. 6 shows a prior art pseudo-static leakage-tolerant LBL technique. This technique employs modifications to the conventional dynamic bitline topology. A first modification is that the read-select input and bitcell data locations on the bitline stack are swapped, and the read-select signals feed the lower (M2) transistors of the LBL. A second modification is the introduction of static-precharge transistors ($P_x$) that are driven actively by the read-select signals. These $P_x$ transistors anchor the bitline static nodes ($V_s$) at $V_{dd}$ when the read-selects are at ground potential. A third modification is the introduction of static 2-input NOR gates, whose inputs are the bitline stack node and bitcell data. The NOR gate outputs drive the upper (M1) transistors of the LBL.

When the read-select inputs are at GND, the NOR gate outputs force the leakage-limiting M1 transistor input to GND. This effectively cuts off the sub-threshold active leakage current path of the bitline, since both the drain and the source of the M1 transistor is maximized due to the full $V_{dd}$ of the source-body bias, which further elevates the $V_t$. As a result, the bitline noise immunity can be increased.

However, the benefit of the pseudo-static technique shown in FIG. 6 is obtained at the cost of degraded performance due to the presence of the additional NOR-gate, and the sub-threshold leakage through $P_x$ and M2.

SUMMARY OF THE PREFERRED EMBODIMENTS

The foregoing and other problems are overcome, and other advantages are realized, in accordance with the presently preferred embodiments of these teachings.

Based on the foregoing description of the prior art, it can be appreciated that the benefit derived from the use of dual-$V_t$ bitlines in a register file, such as decreased bitline active leakage currents and reduced bitline noise immunity scaling trend, is achieved at the cost of degraded performance due to a high $V_t$. This invention overcomes these problems by increasing the performance of a register file that is constructed to include dual-$V_t$ bitlines. The invention employs a boost of the drive signal for one of the transistors of a bitline circuit, preferably for the read-selection transistor of a local bitline (LBL) circuit. The drive signal amplitude is made greater than the normal supply voltage by some increment delta V.

In one aspect this invention provides a register file supplied by a supply voltage $V_{dd}$ and that includes a plurality of threshold voltage $V_t$ bitlines. Each of the plurality of $V_t$ bitlines includes a read-selection transistor having a gate coupled to a dynamic read selection (RS) signal. In accordance with this invention there is a circuit interposed between the RS signal and the gate for increasing a level of a drive signal applied to the gate to be greater than $V_{dd}$.

In one embodiment the circuit generates the increase in the drive signal using a bootstrap capacitance, and in another embodiment the increase in the drive signal is achieved by using a voltage level shifter circuit that is powered from a supply voltage that exceeds $V_{dd}$.

Also disclosed is a method for use in dual-$V_t$ bitline circuit that includes a high-$V_t$ read-selection transistor and a low-$V_t$ bitcell data transistor. The method increases the drive current to the high-$V_t$ transistor and includes (a) applying a read select (RS) signal; and (b) boosting the maximum voltage level of the RS signal so that it exceeds the level of the circuit supply voltage $V_{dd}$ before applying the RS signal to the gate of the high-$V_t$ read-selection transistor.

More generally, the teachings of this invention can be used with dual-$V_t$ bitlines or single-$V_t$ bitlines.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
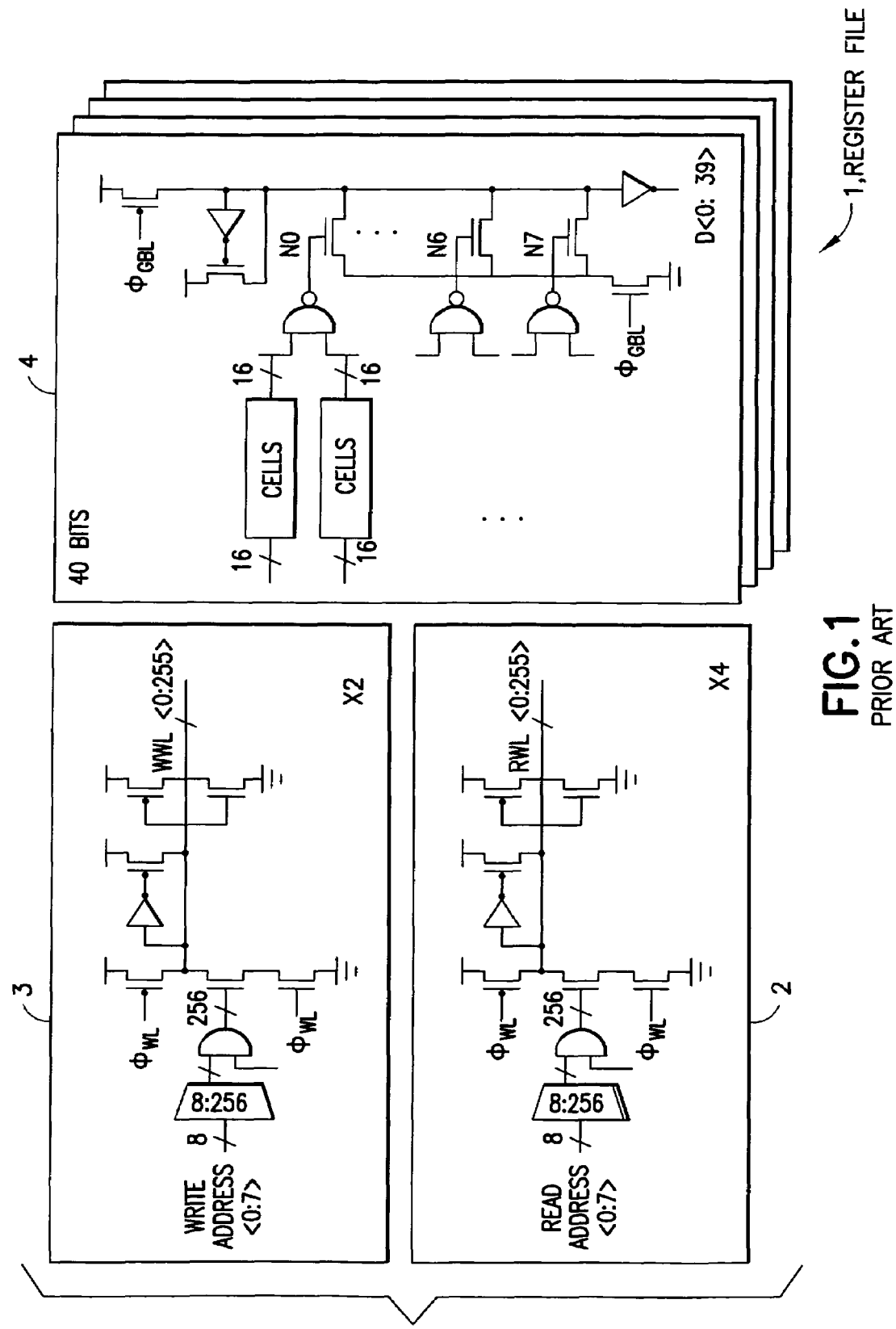
FIG. 1 is schematic diagram of a conventional 256×40-bit register file.
Figure 2:
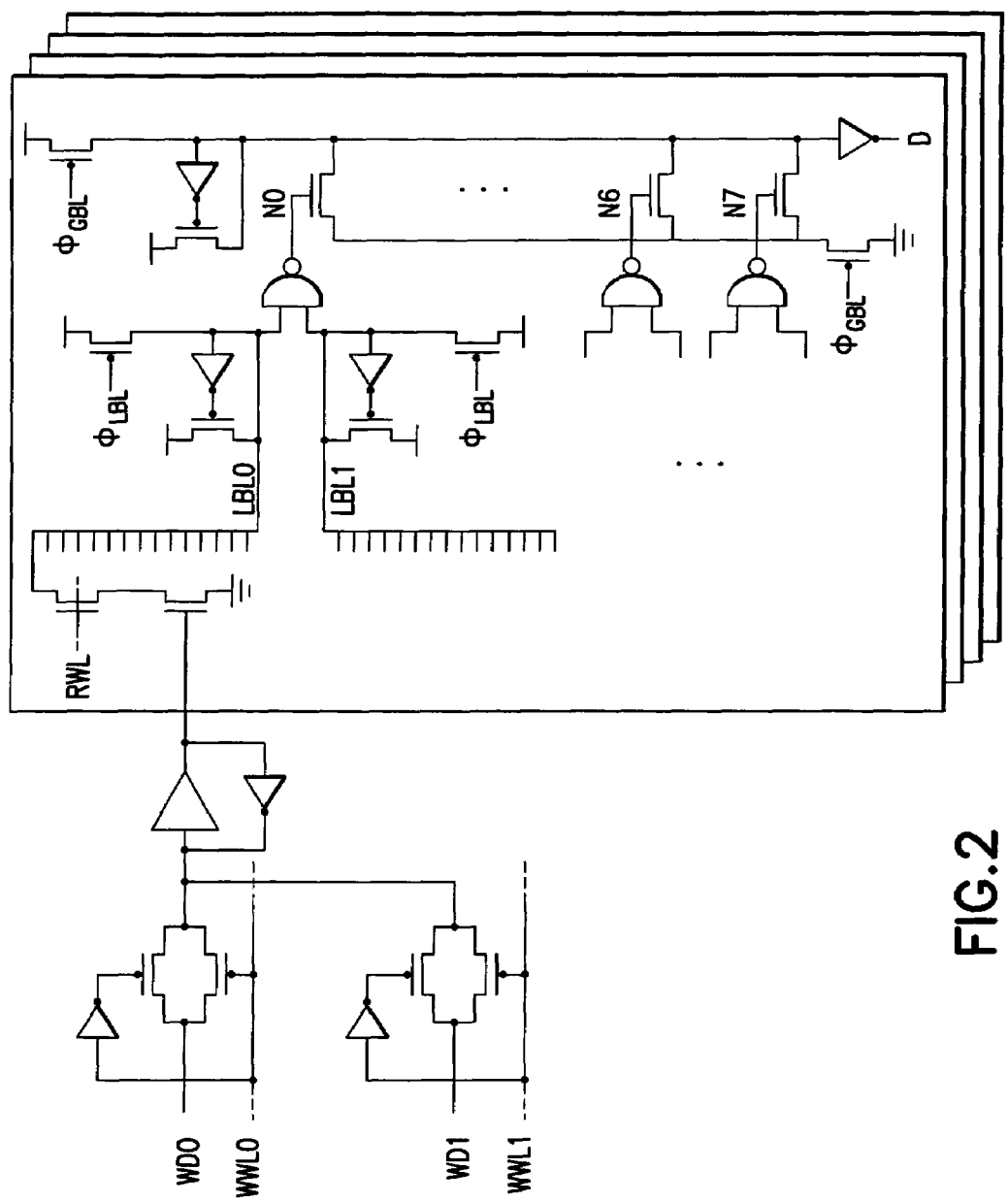
FIG. 2 is a schematic diagram of a conventional one bit slice for a read-port path of the register file of FIG. 1.
Figure 3:
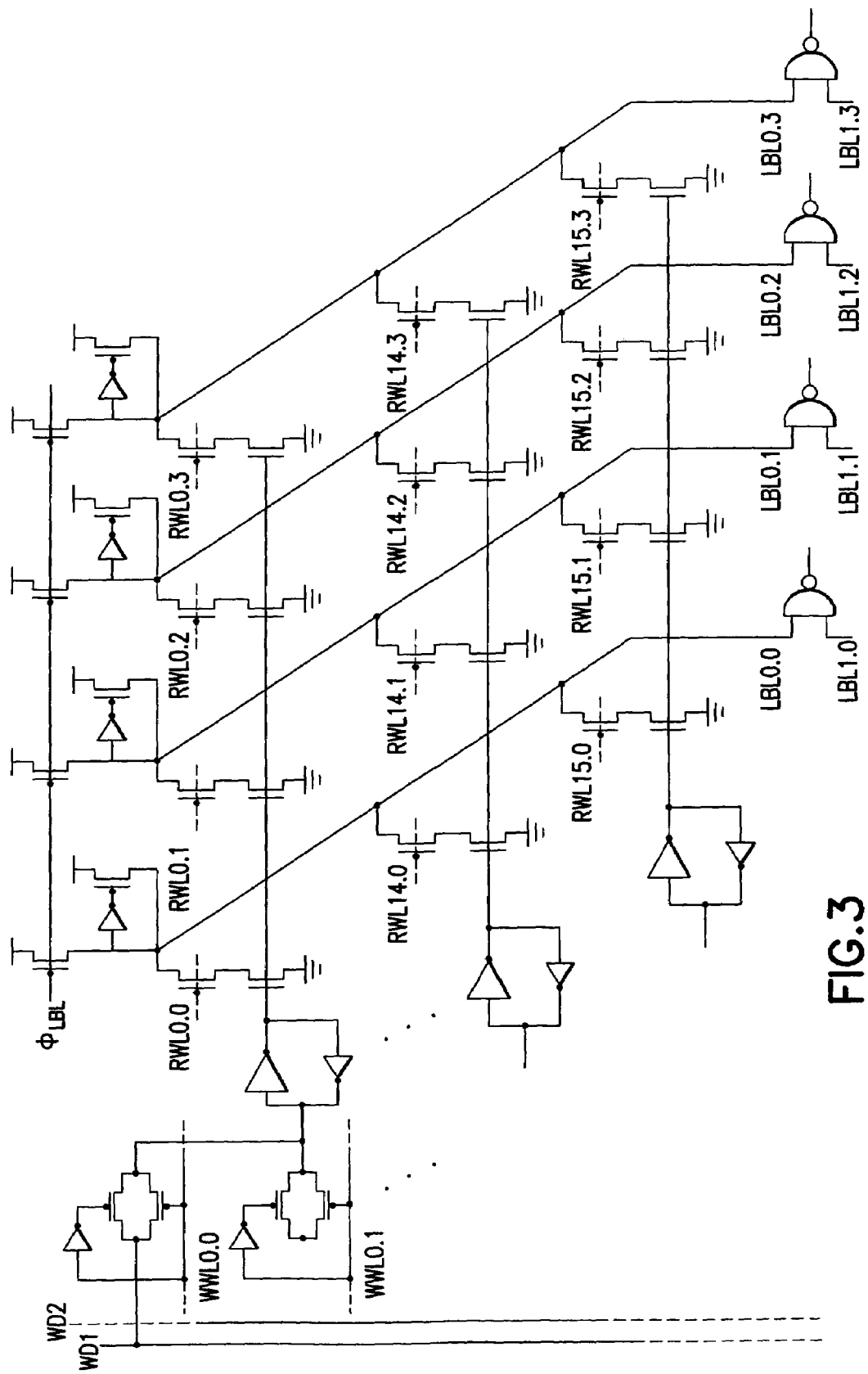
FIG. 3 shows a conventional local bitline arrangement.
Figure 4:
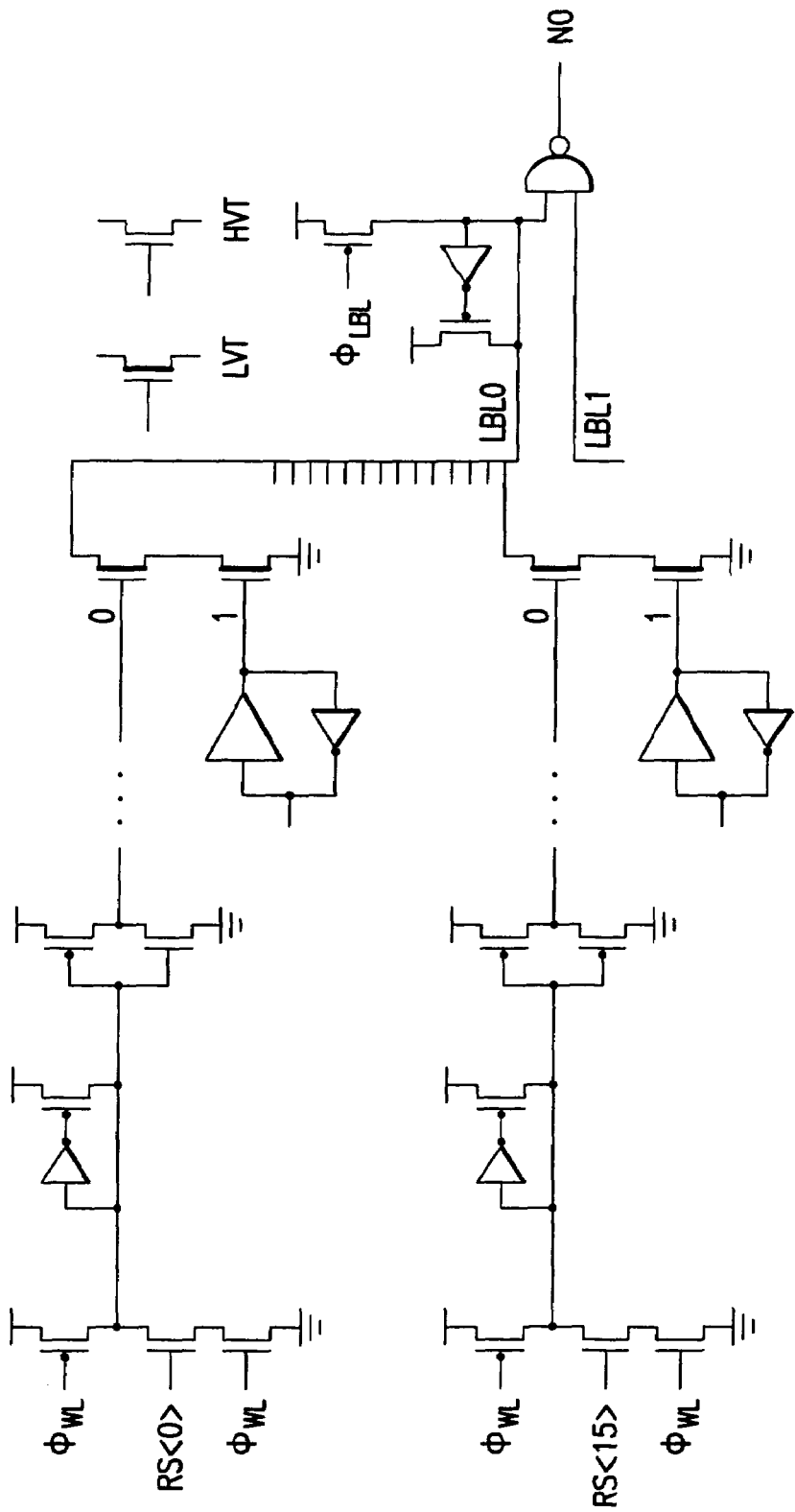
FIG. 4 shows a schematic of a conventional local bitline arrangement for worst-case read-select input noise uses two low-$V_t$ transistors.
Figure 5:
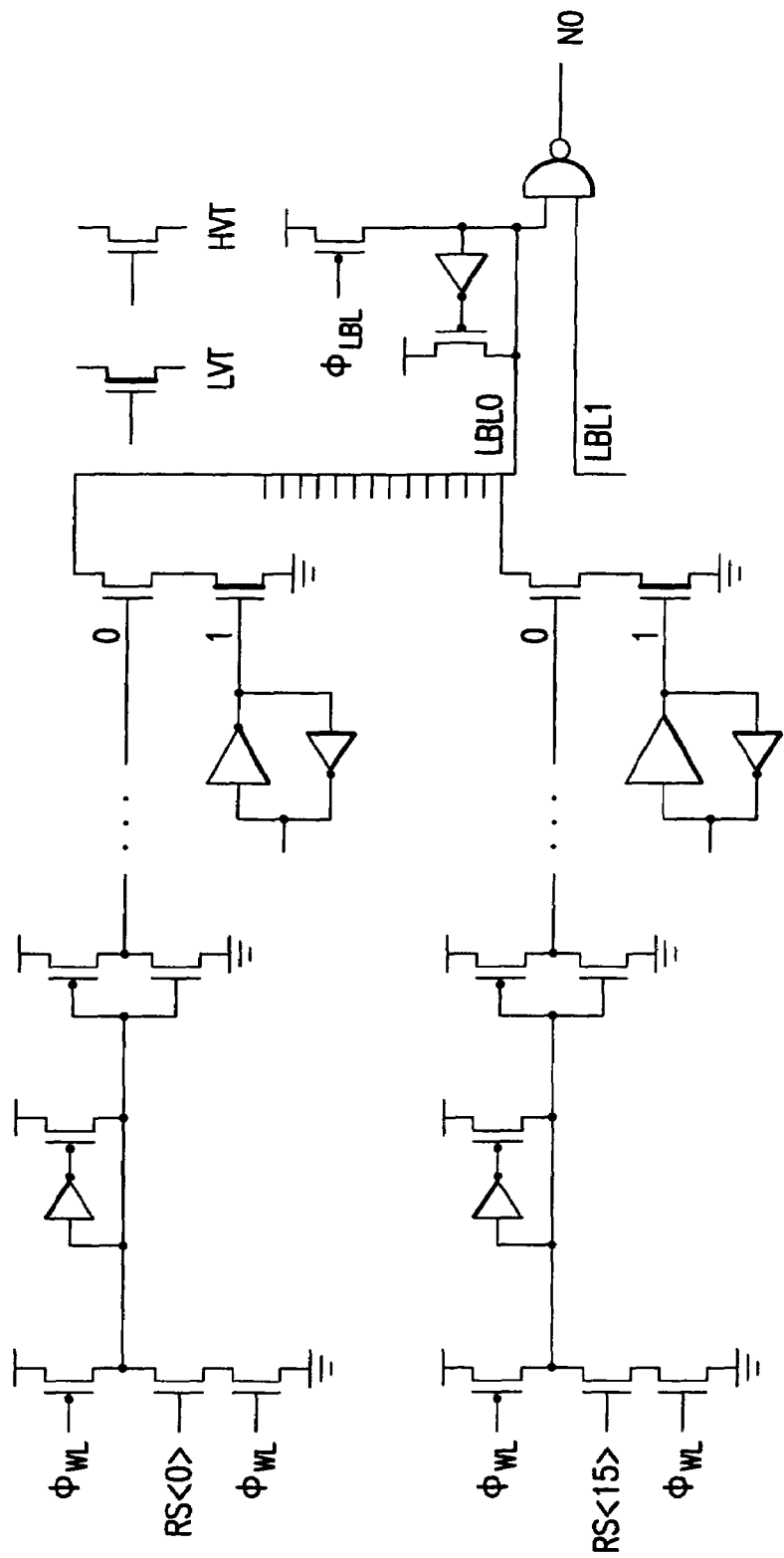
FIG. 5 shows a conventional dual-$V_t$ local bitline arrangement that uses only one low-V, transistor.
Figure 6:
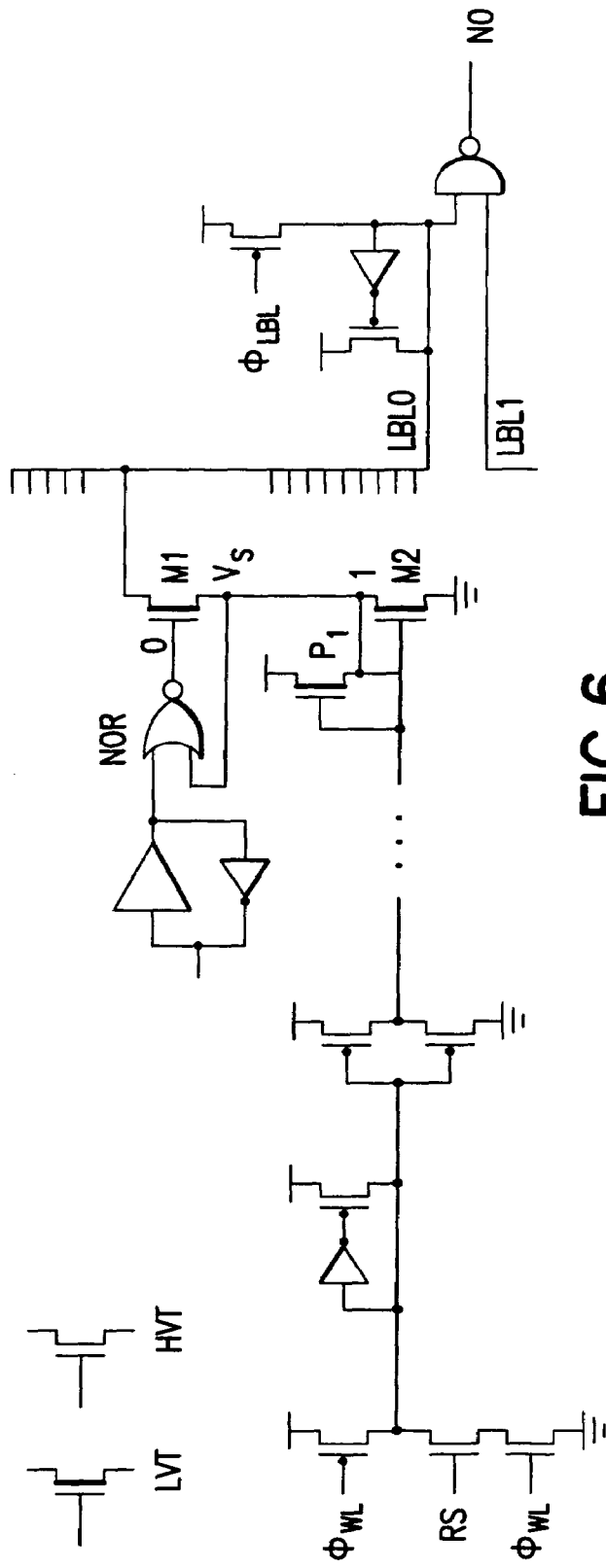
FIG. 6 is a schematic diagram of a conventional pseudo static low-$V_t$ Local bitline arrangement.
Figure 7:
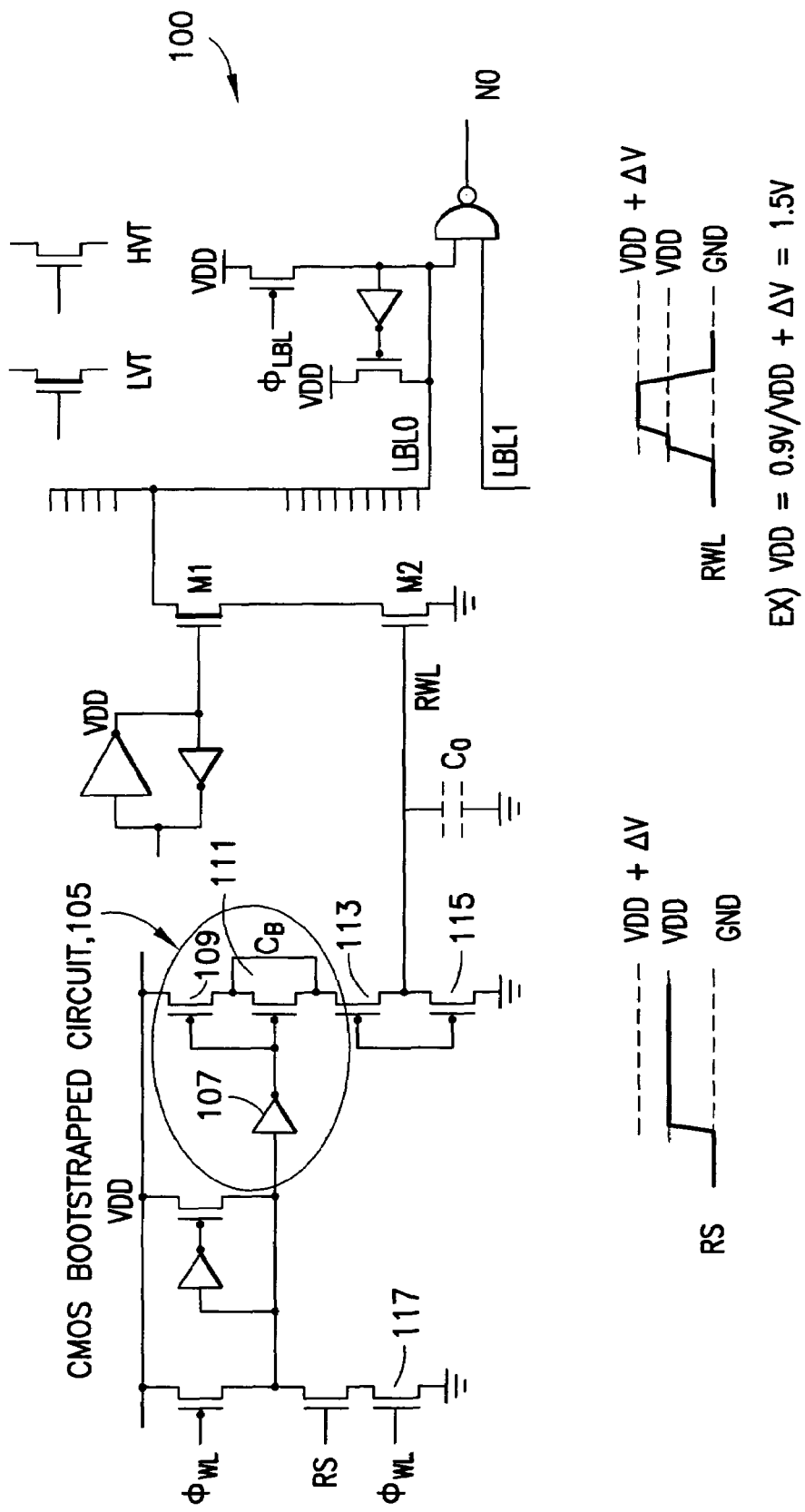
FIG. 7 is a schematic diagram of a dual-$V_t$ local bitline driven by a CMOS bootstrapped circuit in accordance with an embodiment of this invention.

FIG. 7 shows a dual-$V_t$ local bitline (LBL) 100 in accordance with this invention. $C_O$ represents the load capacitance of a read wordline (RWL) coupled to the gate of M2. Unlike the conventional dynamic bitline techniques, the high-$V_t$ transistor (M2) is turned on by a dynamic signal RWL whose maximum voltage level $V_{RWL}$ is greater than that of the supply voltage $V_{dd}$ applied to the remainder of the register file circuits. The dynamic signal RWL, with the maximum voltage level $V_{RWL}$, is generated internally by a CMOS bootstrap circuit 105. The CMOS bootstrap circuit 105 is constructed to include an inverter 107 that drives p-channel FETs 109 and 111, where FET 111 is connected to form a parasitic bootstrap capacitance $C_B$. As a result of the operation of the CMOS bootstrap circuit 105 the $V_{GS}$ of M2 is boosted by an amount delta V ($\Delta V$) with parasitic capacitance $C_B$ after outputting a $V_{dd}$ pulse. The boost ratio is defined by:

$$\Delta V/V_{dd}=(C_B/(C_B+C_O))*V_{dd}. \quad (1)$$

As an example, $V_{dd}$ may equal 0.9V, and $V_{dd}+\Delta V$ may equal 1.5V.

Describing the operation of the circuit in further detail, the bootstrap circuit 105 is connected to a p-FET 113, which in turn is connected to an n-channel FET 115. The output taken between FETs 113 and 115, which function as an inverter, is coupled to the RWL, and thus to the gate of the HVT transistor M2. The RS input signal is applied to the gate of an input n-channel FET 117. When RS goes high (the active state of RS in this example) the output of FET 117 goes low. This turns on p-FET 113 and turns off n-FET 115. After a short propagation delay (e.g., about a nanosecond) through inverter 107 the low signal at the input to the inverter 107 goes high at the output of the inverter 107, thereby turning off p-FETs 109 and 111. The bootstrap capacitance $C_B$ then discharges through the p-FET 113 (which is turned on), thereby injecting charge into the RWL bus, resulting in the $\Delta V$ boost in the signal appearing at the gate of M2. When RS goes low (inactive) the output of FET 117 goes high, thereby turning on p-FETs 109 and 111 via inverter 107, and recharging $C_B$ from $V_{dd}$, via FET 109. When the output of FET 117 goes high this also turns off p-FET 113 and turns on n-FET 115, thereby discharging the RWL capacitance $C_O$ through FET 115 to ground.

Figure 8:
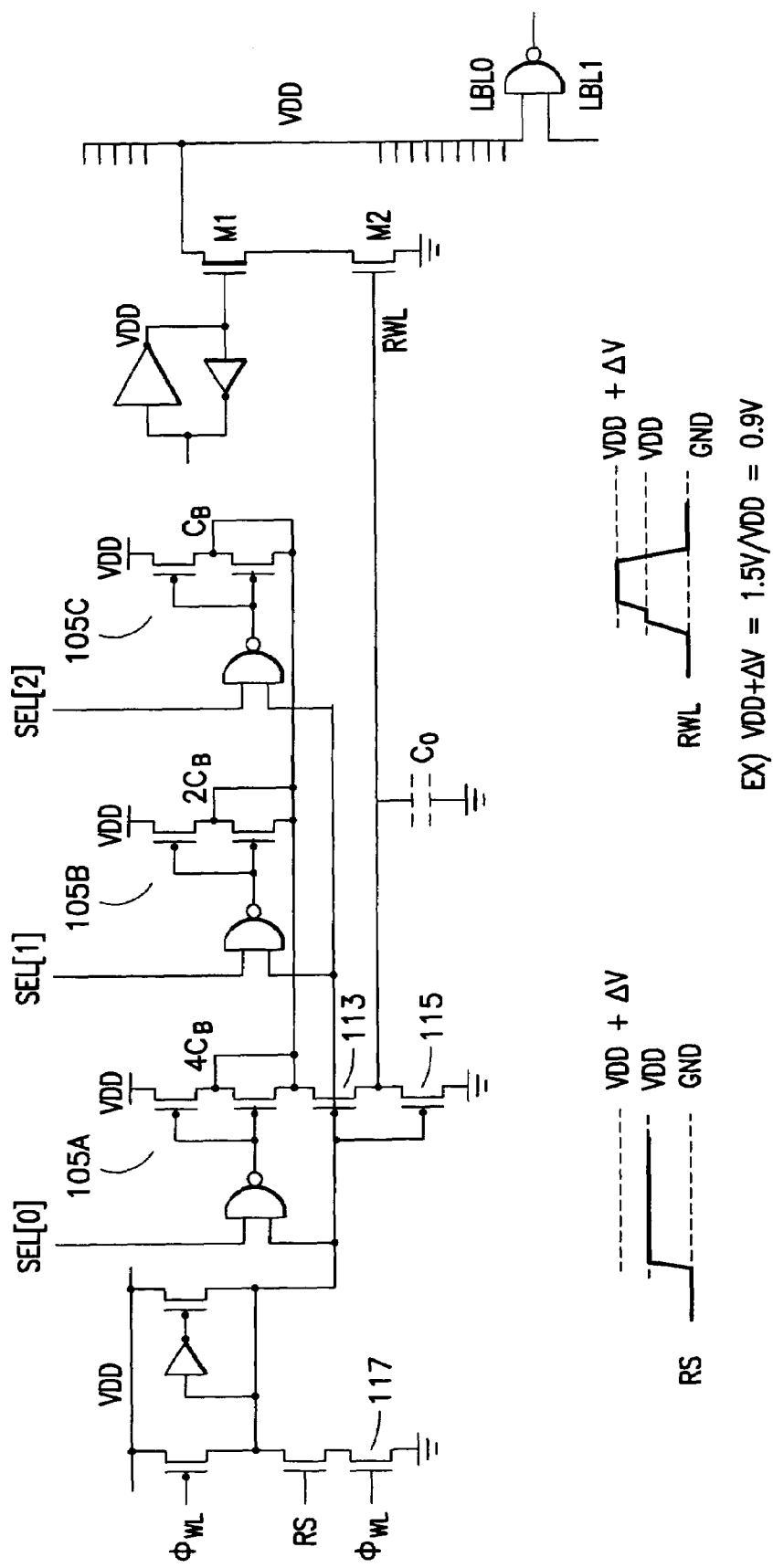
FIG. 8 is a schematic diagram of the dual-$V_t$ local bitline driven by the CMOS bootstrapped circuit in accordance with a second embodiment of this invention, where a boost ratio control function is implemented using a plurality of selectable bootstrap circuits.

FIG. 8 shows the use of a plurality (e.g., three) bootstrap circuits 105A, 105B and 105C coupled together in parallel that are individually selectable with select (SEL) signals SEL(0), SEL(1) and SEL(2), respectively. Note that the bootstrap circuits 105A, 105B and 105C can be identical except for the value of $C_B(4*C_B, 2*C_B$ and $C_B$, respectively). The boost ratio may be defined as follows:

$$\Delta V_{SEL[0:2]}/V_{dd}=(C_x/(C_x+C_O))*V_{dd}, \quad (2)$$

where $$[C_x=SEL[0]*4*C_B+SEL[1]*2*C_B+SEL[2]*C_B],$$

and where * denotes multiplication. Note that more than one of the selection signals can be active at any given time.

Figure 9:
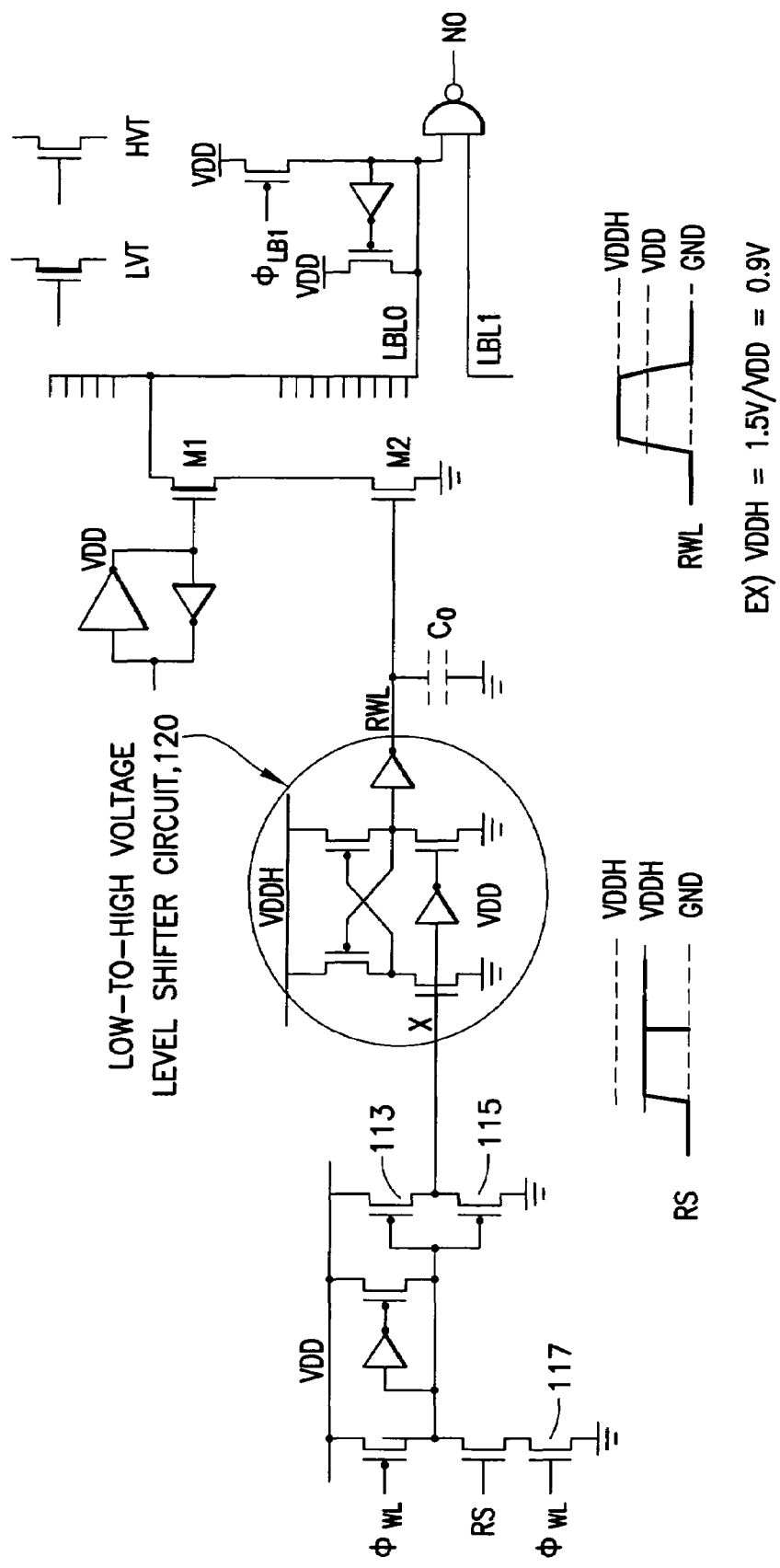
FIG. 9 is a schematic diagram of a dual-$V_t$ local bitline driven by a column of low-to-high level shifter circuits in accordance with a further embodiment of this invention.

FIG. 9 is a schematic diagram of a dual-$V_t$ local bitline driven by a low-to-high voltage level shifter circuit 120 in accordance with a further embodiment of this invention. In this embodiment the dynamic signal RWL is boosted up by supplying only the voltage level shifter circuit 120 with a higher supply voltage ($V_{ddH}$) that the normal supply voltage $V_{dd}$ used by the other circuits of the register file (e.g., 1.5V versus 0.9V).

These techniques solve the degraded performance problem of a register file with dual-$V_t$ dynamic bitlines, as well as the poor bitline noise immunity scaling trend due to active leakage currents.

Based on the foregoing description of the preferred embodiments it should be appreciated that this invention provides a technique to enhance the performance of the register file with dual-$V_t$ dynamic bitlines. In the dual-$V_t$ bitlines the high-$V_t$ transistors (M2) are turned on by a dynamic signal with a higher voltage than $V_{dd}$. The boosted dynamic signal makes the gate-to-source voltage of the high-$V_t$ transistors greater than the drain-to-source voltage. The dynamic signal is internally generated by, in one embodiment, the CMOS bootstrapped circuit 105 or, in another embodiment, by the column of low-to-high voltage level shifter circuits 120.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other similar or equivalent types of circuits to boost the drive signal to a higher voltage signal may be employed. Similarly, this invention can be used with any type of register file structure with dual-$V_t$ or multiple-$V_t$ dynamic bitlines. In addition, it should be noted that this invention can be used as well with single $V_t$ architectures, where the read-selection transistor and the data transistor are both either low-$V_t$(LVT) or high-$V_t$(HVT) transistors. Furthermore, while shown in FIGS. 7, 8 and 9 to be applied to the local bitlines (LBLs), this invention can be applied as well to global bitlines (GBLs). However, all such and similar modifications of the teachings of this invention will still fall within the scope of this invention.

What is claimed is:

1. A register file supplied by a supply voltage $V_{dd}$ and comprising a plurality of threshold voltage $V_t$ bitlines, each of said plurality of $V_t$ bitlines comprising a read-selection transistor having a gate coupled to a dynamic read selection (RS) signal, further comprising a circuit interposed between the RS signal and the gate for increasing a level of a drive signal applied to the gate to be greater than $V_{dd}$.

2. A register file as in claim 1, where the each of the plurality of $V_t$ bitlines comprise local bitlines (LBLs).

3. A register file as in claim 1, where the read-selection transistor is comprised of a high voltage threshold transistor that is coupled in series with a lower voltage threshold bitcell data transistor.

4. A register file as in claim 1, where the circuit is powered by the supply voltage $V_{dd}$ and is comprised of a driver having an input coupled to the dynamic read selection (RS) signal and an output coupled to a gate of a FET that is coupled in series with a bootstrap capacitance $C_B$ for selectively discharging $C_B$ to increase the level of the drive signal.

5. A register file as in claim 4, where the circuit operates to boost the $V_{GS}$ of the read-selection transistor by an amount delta V ($\Delta$V), where the boost ratio is defined by:

$$\Delta V/V_{dd}=(C_B/(C_B+C_O))*V_{dd},$$

where $C_O$ represents the load capacitance of a read wordline (RWL) coupled to the gate of the read-selection transistor.

6. A register file as in claim 5, where $V_{dd}$ equals about 0.9V, and $V_{dd}+\Delta V$ equals about 1.5V.

7. A register file as in claim 5, where there are a plurality of individually selectable boost circuits having their inputs coupled together in parallel to the dynamic read selection (RS) signal and their outputs coupled together for providing a plurality of selectable boost ratios at the gate of the read-selection transistor.

8. A register file as in claim 1, where the circuit is powered by a supply voltage that is greater than $V_{dd}$ ($V_{ddH}$) and is comprised of a driver having an input coupled to the dynamic read selection (RS) signal and an output coupled to a gate of a FET, where an output of the circuit is taken from a second driver having an input coupled to an output of the FET.

9. A register file supplied by a supply voltage $V_{dd}$ and comprising a plurality of dual threshold voltage $V_t$ local bitlines (LBLs), each of the dual $V_t$ bitlines comprising a high voltage threshold read-selection transistor (M2) having a gate coupled to a dynamic read selection (RS) signal and coupled in series with a lower voltage threshold bitcell data transistor (M1), further comprising a circuit interposed between the RS signal and the gate of M2 for increasing a level of a drive signal applied to the gate to be greater than $V_{dd}$.

10. A register file as in claim 9, where the circuit is powered by the supply voltage $V_{dd}$ and is comprised of a driver having an input coupled to the dynamic read selection (RS) signal, and an output coupled to a gate of a FET that is coupled in series with a bootstrap capacitance $C_B$ for selectively discharging $C_B$ to increase the level of the drive signal.

11. A register file as in claim 10, where the circuit operates to boost the $V_{GS}$ of M2 by an amount delta V ($\Delta$V), where the boost ratio is defined by:

$$\Delta V/V_{dd}=(C_B/(C_B+C_O))*V_{dd},$$

where $C_O$ represents the load capacitance of a read wordline (RWL) coupled to the gate of M2.

12. A register file as in claim 11, where $V_{dd}$ equals about 0.9V, and $V_{dd}+\Delta V$ equals about 1.5V.

13. A register file as in claim 10, where there are a plurality of individually selectable boost circuits having their inputs coupled together in parallel to the dynamic read selection (RS) signal and their outputs coupled together for providing a plurality of selectable boost ratios at the gate of M2.

14. A register file as in claim 9, where the circuit is powered by a supply voltage that is greater than $V_{dd}$ ($V_{ddH}$) and is comprised of a driver having an input coupled to the dynamic read selection (RS) signal and an output coupled to a gate of a FET, where an output of the circuit is taken from a second driver having an input coupled to an output of the FET.

15. In a dual-$V_t$ bitline circuit comprising a high-$V_t$ read-selection transistor and a low-$V_t$ bitcell data transistor, a method to increase the drive current to the high-$V_t$ transistor comprising:

applying a read select (RS) signal; and boosting the maximum voltage level of the RS signal so that it exceeds the level of the circuit supply voltage $V_{dd}$ before applying the RS signal to the gate of the high-$V_t$ read-selection transistor.

16. A method as in claim 15, where boosting comprises operating a circuit powered by the supply voltage $V_{dd}$ and that is comprised of a driver having an input coupled to the RS signal and an output coupled to a gate of a FET that is coupled in series with a bootstrap capacitance $C_B$ for selectively discharging $C_B$ to increase the level of a drive signal coupled to the gate of the high-$V_t$ read-selection transistor.

17. A method as in claim 16, where the circuit operates to boost the $V_{GS}$ of the high-$V_t$ read-selection transistor by an amount delta V ($\Delta$V), where the boost ratio is defined by:

$$\Delta V/V_{dd}=(C_B/(C_B+C_O))*V_{dd},$$

where $C_O$ represents the load capacitance of a read wordline (RWL) coupled to the gate of the high-$V_t$ read-selection transistor.

18. A method as in claim 17, where $V_{dd}$ equals about 0.9V, and $V_{dd}+\Delta V$ equals about 1.5V.

19. A method as in claim 16, where there are a plurality of individually selectable boost circuits having their inputs coupled together in parallel to RS signal and their outputs coupled together for providing a plurality of selectable boost ratios at the gate of the high-$V_t$ read-selection transistor.

20. A method as in claim 15, where the circuit is powered by a supply voltage that is greater than $V_{dd}$($V_{ddH}$) and is comprised of a driver having an input coupled to RS signal and an output coupled to a gate of a FET, where an output of the circuit is coupled to the gate of the high-$V_t$ read-selection transistor and is taken from a second driver having an input coupled to an output of the FET.

21. A register file supplied by a supply voltage $V_{dd}$ and comprising single threshold voltage $V_t$ bitlines, each of said bitlines comprising a read-selection transistor having a gate coupled to a dynamic read selection (RS) signal, further comprising a circuit interposed between the RS signal and the gate for increasing a level of a drive signal applied to the gate to be greater than $V_{dd}$.

22. A register file as in claim 21, where the read-selection transistor is comprised of a high voltage threshold transistor that is coupled in series with a high voltage threshold bitcell data transistor.

23. A register file as in claim 21, where the read-selection transistor is comprised of a low voltage threshold transistor that is coupled in series with a low voltage threshold bitcell data transistor.

24. A register file as in claim 21, where the circuit is powered by the supply voltage $V_{dd}$ and is comprised of a driver having an input coupled to the dynamic read selection (RS) signal, and an output coupled to a gate of a FET that is coupled in series with a bootstrap capacitance $C_B$ for selectively discharging $C_B$ to increase the level of the drive signal.

25. A register file as in claim 24, where the circuit operates to boost the $V_{GS}$ of the read-selection transistor by an amount delta V ($\Delta V$), where the boost ratio is defined by:

$$\Delta V/V_{dd} = (C_B/(C_B + C_O)) * V_{dd},$$

where $C_O$ represents the load capacitance of a read wordline (RWL) coupled to the gate of the read-selection transistor.

26. A register file as in claim 25, where $V_{dd}$ equals about 0.9V, and $V_{dd} + \Delta V$ equals about 1.5V.

27. A register file as in claim 25, where there are a plurality of individually selectable boost circuits having their inputs coupled together in parallel to the dynamic read selection (RS) signal and their outputs coupled together for providing a plurality of selectable boost ratios at the gate of the read-selection transistor.

28. A register file as in claim 21, where the circuit is powered by a supply voltage that is greater than $V_{dd}(V_{ddH})$ and is comprised of a driver having an input coupled to the dynamic read selection (RS) signal and an output coupled to a gate of a FET, where an output of the circuit is taken from a second driver having an input coupled to an output of the FET.

* * * * *